US005546025A

United States Patent [19]
Casselman

[11] Patent Number: 5,546,025
[45] Date of Patent: Aug. 13, 1996

[54] LOW FREQUENCY DISCRIMATOR USING UPPER AND LOWER THRESHOLDS

[75] Inventor: Patrick H. Casselman, Ogdensburg, N.Y.

[73] Assignee: Mitel, Inc., Canada

[21] Appl. No.: 212,598

[22] Filed: Mar. 11, 1994

[51] Int. Cl.[6] .................................................. H03D 13/00
[52] U.S. Cl. .......................... 327/43; 327/39; 327/47; 327/49; 327/74
[58] Field of Search ............................ 327/39–46, 50, 327/74, 76, 47–49

[56] References Cited

U.S. PATENT DOCUMENTS

| | | | |
|---|---|---|---|
| 3,628,165 | 12/1971 | Swan, Jr. | 329/104 |
| 3,675,132 | 7/1972 | Hansen et al. | 325/423 |
| 3,753,130 | 8/1973 | Pezzutti | 328/141 |
| 3,758,866 | 9/1973 | Hansen et al. | 328/127 |
| 4,087,756 | 5/1978 | Rogers, Jr. | 329/50 |
| 4,191,930 | 3/1980 | Harzer | 331/1 A |
| 4,322,642 | 3/1982 | Sugasawa | 307/522 |
| 4,507,578 | 3/1985 | Matsuda | 307/520 |
| 4,554,517 | 11/1985 | Parniere et al. | 332/18 |
| 4,590,440 | 5/1986 | Haque et al. | 331/17 |
| 4,843,332 | 6/1989 | Cok et al. | 328/133 |
| 4,918,405 | 4/1990 | Herleikson | 331/11 |
| 5,180,935 | 1/1993 | Abdi et al. | 307/524 |

Primary Examiner—Timothy P. Callahan
Assistant Examiner—Kenneth B. Wells
Attorney, Agent, or Firm—Charles E. Wands

[57] ABSTRACT

The present invention relates to a low frequency discriminator circuit comprised if apparatus for providing a rectangular wave input signal, apparatus for integrating the input signal, apparatus for detecting whether the integrated input signal falls between upper and lower thresholds respectively, and apparatus for providing an output signal indicating when the integrated input signal falls between the thresholds, whereby the frequency of the input signal may be determined to be between higher and lower limits.

12 Claims, 1 Drawing Sheet

5,546,025

LOW FREQUENCY DISCRIMATOR USING UPPER AND LOWER THRESHOLDS

FIELD OF THE INVENTION

This invention relates to the field of low frequency discriminator circuits, and in particular to a circuit that can discriminate low frequency telephone ringing signals within a predetermined range.

BACKGROUND TO THE INVENTION

There are requirements from time to time to discriminate between various frequency signals at the low end of the frequency spectrum. One example of this requirement is to have the capability of detecting ringing signals in Germany over a narrow frequency band of 23 Hz to 54 Hz. The same detector is also required to not detect ringing signals that are at or below 18 Hz., or above 64 Hz. The detection is desired to cause a logic signal that can be read by a microprocessor.

Attempts to achieve this type of requirement have resulted in software programs which count timing intervals of a rectangular wave generated by a portion of a ringing detector circuit. This approach has worked well in high speed microprocessor based systems and in systems that have short intervals between interrupt requests that use routines related to the interrupt intervals when discriminating between low frequency signals.

However, this approach has been found not to work well in many slower microprocessor based systems, or in systems which have relatively wide spacing between interrupt requests when associated interrupt routines are used for low frequency discrimination.

SUMMARY OF THE INVENTION

The present invention can discriminate between low frequency signals, and provides a logic output which can be read by slow microprocessor based systems. In general, the input signal is integrated using two different time constants each related to the boundaries of the frequency range to be detected, the integrated results respectively being tested against upper and lower thresholds. The results of the tests are applied to latches, preferably formed by flip flops, for generation of logic signals that can be read by a microprocessor.

In accordance with an embodiment of the invention, a low frequency discriminator circuit is comprised of apparatus for providing a rectangular wave input signal, apparatus for integrating the input signal, apparatus for detecting whether the integrated input signal falls between upper and lower thresholds respectively, and apparatus for providing an output signal indicating when the integrated input signal falls between the thresholds, whereby the frequency of the input signal may be determined to be between higher and lower limits.

In accordance with a preferred embodiment, in the aforenoted circuit the apparatus for providing the input signal is comprised of apparatus for splitting an input signal into two circuit paths, and wherein the integrating apparatus is comprised of apparatus for integrating the input signal in each of the circuit paths using different time constants respectively relating to the higher and lower frequency limits.

In accordance with the preferred embodiment, the detecting apparatus is comprised of a pair of comparators, each set to a threshold, for receiving a corresponding integrated input signal and for providing an output signal of one or another polarity depending on whether the corresponding integrated input signal is above or below its threshold, the apparatus for providing an output signal being comprised of a pair of flip flops each for receiving the output signal of one or another logic level and for providing a TRUE or FALSE output depending on the logic level input thereto.

BRIEF DESCRIPTION OF THE DRAWINGS

A better understanding of the invention will be obtained by reading the description of the invention below, with reference to the following drawings, in which.

DETAILED DESCRIPTION OF A PREFERED EMBODIMENT

Figure 1:
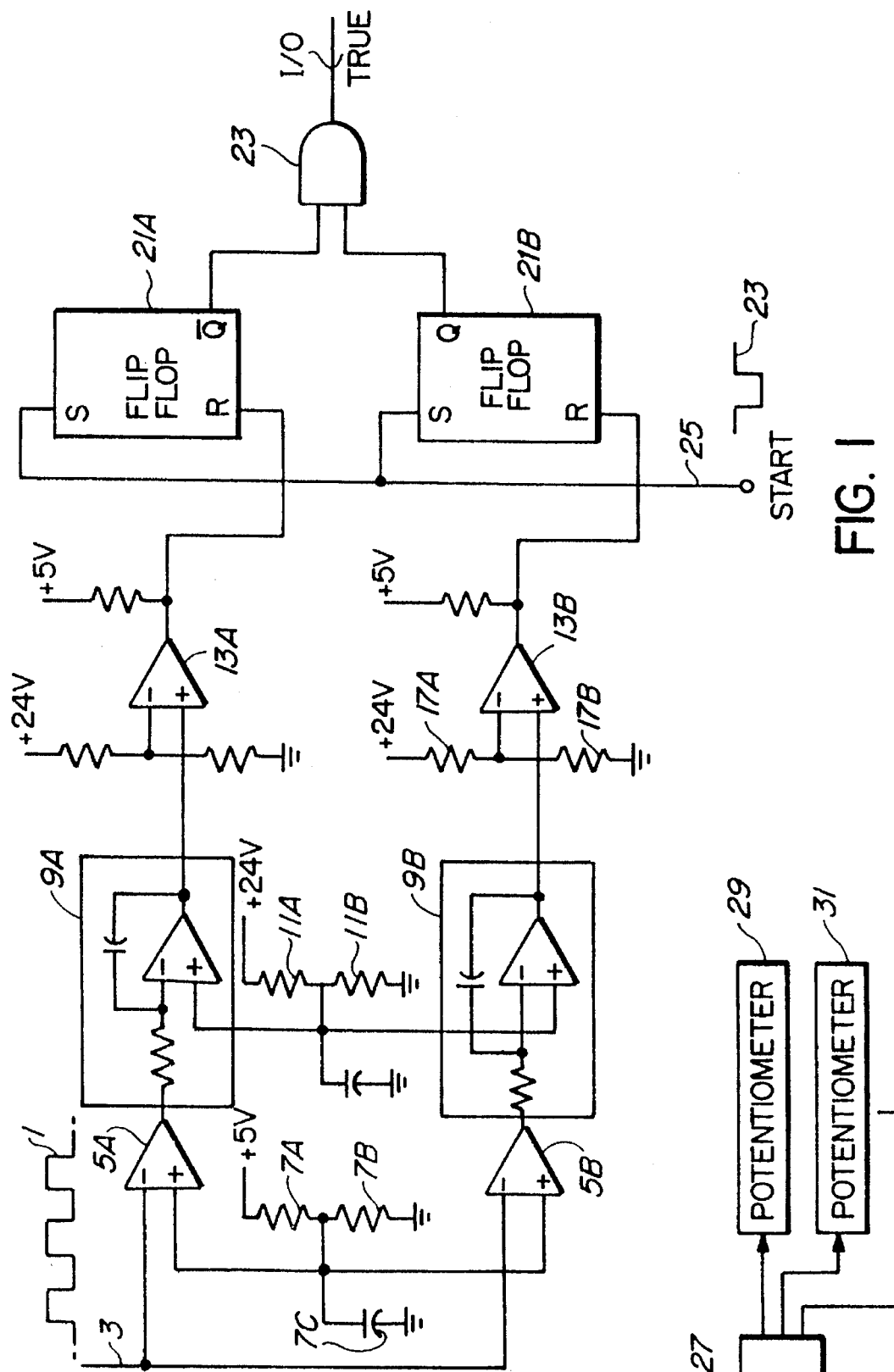
FIG. 1 is a schematic diagram of the preferred embodiment of the invention.

Turning to FIG. 1, an input signal is received at input 3, where it is split into two paths, each leading to the inverting input of an operational amplifier 5A and 5B. The noninverting inputs of amplifiers 5A and 5B are connected together in a conventional way to the tap of a voltage divider comprised of series resistors 7A and 7B which are connected between +5 V. and ground, bypassed with capacitor 7C.

The outputs of amplifiers 5A and 5B are applied to integrators 9A and 9B respectively, which are also connected to the tap of a voltage divider comprised of series resistors 11A and 11B, bypassed with capacitor 11C. The time constant of the integrators are different, and establish different integration output signal ramp slopes. For example, the time constant of integrator 9A can be established by a resistor of 30K ohms and a capacitor of 0.1 microfarad, while the time constant of integrator 9B can be established by a resistor of 75K ohms and a capacitor of 0.1 microfarad.

The outputs of the integrators are connected to respective inverting inputs of comparators 13A and 13B. The noninverting inputs of comparators 13A and 13B are respectively connected to the taps of voltage dividers comprised of series resistors 15A and 15B for one comparator and series resistors 17A and 17B for the other, which series resistors are connected between a d.c. voltage source (e.g. +24 volts) and ground. In one embodiment, the values of these resistors were chosen to provide +3.85 volts at the inverting input of comparator 13A and +2.2 volts at the inverting input of comparator 13B.

Load resistors 19A and 19B connect the outputs of the respective comparators 13A and 13B to a source of voltage, e.g. +5 V.

The outputs of the comparators are connected to the reset (R) inputs of respective flip flops 21A and 21B of a latch. In one embodiment the /Q and Q outputs respectively of flip flops 21A and 21B are connected to the inputs of an AND gate 23.

In operation, the input signal is applied to input 3, and must be rectangular in form, the timing of which is dependent on the frequency of the signal to be discriminated. If the signal to be detected is a sine wave, it should be converted to a rectangular waveform prior to application to this circuit.

The input signal is applied equally to operational amplifiers 5A and 5B, where they are buffered and inverted. Of course, if the input signal is already split, buffered and in suitable form to be integrated, the buffering and inverting stage may be deleted.

The output signal from operational amplifiers 5A and 5B are applied to integrators 9A and 9B, which integrate the rectangular waveshapes into ramps, having different time constants. Thus for example the ramp of a rectangular wave will rise slower when integrated in integrator 9B than when integrated in integrator 9A.

The outputs of the integrators are applied to comparators 13A and 13B, where they are compared against respective upper and lower thresholds. The thresholds are set so that the comparators will trip to a low logic level state when the input signals thereto fall below their respective thresholds. Thus the output of comparator 13A will go to low logic level when the input frequency is below an upper threshold, and the output of comparator 13B will go to low logic level when the input frequency is below a lower threshold.

The outputs of comparators 13A and 13B are input to the reset inputs to flip flops 21A and 21B, and result in the following truth table at their outputs:

| Test Input Freq (Hz) | FF 21A (60 Hz thresh.) | FF 21B (20 Hz thresh.) |
| --- | --- | --- |
| 0 | 0 | 1 |
| 18 | 1 | 0 |
| 23 | 1 | 1 |
| 54 | 1 | 1 |
| 64 | 0 | 1 |

These output signals may be read through an input/output port of a microprocessor to determine whether a valid frequency in the range between the upper and lower frequency thresholds have been detected. However, to initiate a test for the occurrence of a valid input frequency, the flip flops must be set. This is obtained by applying a set input signal 23 to a start input 25, which input is connected to the set (S) inputs of flip flops 21A and 21B. The set input signal should be a temporary low logic rectangular wave of about 80 ms. Once set, the outputs of the flip flops should be monitored for appropriate states as indicated by the truth table example above.

To have the input frequency continuously monitored, the set input signal can be applied at the frequency of the input signal, and may be usefully obtained from the microprocessor, or from another circuit and derived from the input signal.

Instead of the microprocessor receiving the logic states from the flip flops 21A and 21B and deducing whether the frequency of the input signal is within range, the /Q output of flip flop 21A and the Q output of flip flop 21B may be applied to respective inputs of AND gate 23. The output of the AND gate provides a TRUE logic signal if the input signal is between the input thresholds. A microprocessor or other circuit can thus distinguish whether the input signal frequency is within or not within the range, by monitoring the output logic level of the AND gate.

It should be noted that the frequencies of different signals may be distinguished by appropriately selecting the resistor and capacitor components of the discriminator stages, and by appropriately selecting the thresholds of the comparators. Electronically controllable potentiometers may be used to select frequency bands under control of a microprocessor.

Figure 2:
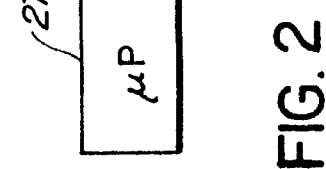
FIG. 2 is a block diagram of an additional aspect of an embodiment of the invention.

A block diagram of such a selection system is shown in FIG. 2. A microprocessor 27 has control outputs connected to electronically controlled potentiometers 29 and 31. Potentiometers 29 and 31 are representative of the voltage dividers formed of resistors 11A and 11B, and representative alternatively of voltage dividers formed of resistors 15A and 15B. Of course it will be understood that two sets of voltage dividers may be controlled by the microprocessor, and as well, the time constant setting capacitors and resistors of integrators 9A and 9B may also be switched and varied as required, by means of microprocessor 27. In this manner the frequencies and bands to be discriminated may be established under program control.

In addition, microprocessor 27 may also output the set signal 25, either when it wishes to make a frequency measurement, or on a cycling basis. In the latter case it must monitor the actual input signal frequency.

A person understanding this invention may now conceive of alternative structures and embodiments or variations of the above. All of those which fall within the scope of the claims appended hereto are considered to be part of the present invention.

I claim:

1. A low frequency discriminator circuit comprising:
   (a) means for providing a rectangular wave input signal,
   (b) means for integrating said input signal,
   (c) means for detecting whether the integrated input signal falls between upper and lower thresholds respectively, and
   (d) means for providing an output signal indicating when the integrated input signal falls between said thresholds,
      whereby the frequency of the input signal may be determined to be between higher and lower limits related to said thresholds,
   (e) said means for providing said input signal comprising means for splitting an input signal into two circuit paths,
   (f) the integrating means comprising means for integrating the input signal in each of the circuit paths using different time constants respectively relating to said higher and lower frequency limits,
   (e) said detecting means comprising a pair of comparators, each set to a threshold, for receiving a corresponding integrated input signal and for providing an output signal of one or another polarity depending on whether the corresponding integrated input signal is above or below its threshold, and
   (f) said means for providing an output signal comprising a pair of flip flops each for receiving said output signal of one or another logic level and for providing a TRUE or FALSE output depending on said logic level input thereto.

2. A discriminator as defined in claim 1, further including an AND gate having one input connected to a /Q output of one of the flip flops and another input connected to a Q output of the other of the flip flops.

3. A discriminator as defined in claim 2, in which said limits of the input signal are approximately 23–54 Hz.

4. A discriminator as defined in claim 1, further including a buffer connected in each of the two circuit paths for receiving the input signal and delivering it to the integrators.

5. A discriminator as defined in claim 1, in which each of the comparators includes a voltage divider for setting the respective thresholds, the voltage dividers being comprised of electronically controllable potentiometers.

6. A discriminator as defined in claim 1, in which the output signals of one or the other polarity are applied to respective reset inputs of the flip flops, and further including means for applying a temporary set input signal to respective set inputs of the flip flops prior to determining the outputs of the flip flops.

7. A discriminator as defined in claim 6, in which the set input signal is cyclical, timed to precede the output signals of one or the other polarity being applied to said reset inputs by an interval of time.

8. A discriminator as defined in claim 6, in which the set input signal is a temporary low logic level square wave pulse.

9. A discriminator as defined in claim 6, in which each of the comparators includes a voltage divider for setting the respective thresholds, the voltage dividers being comprised of electronically controllable potentiometers.

10. A discriminator as defined in claim 9, further including an AND gate having one input connected to a /Q output of one of the flip flops and another input connected to a Q output of the other of the flip flops.

11. A discriminator as defined in claim 10, further including a buffer connected in each of the two circuit paths for receiving the input signal and delivering said input signal to the integrators.

12. A discriminator as defined in claim 11, in which said limits of the input signal are approximately 23–54 Hz.

* * * * *